(12) United States Patent
Sankaran et al.

(10) Patent No.: US 8,760,899 B1
(45) Date of Patent: Jun. 24, 2014

(54) FREQUENCY MULTIPLIER

(71) Applicant: Texas Instruments Incorporated, Dallas, TX (US)

(72) Inventors: Swaminathan Sankaran, Allen, TX (US); Vijaya B. Rentala, Plano, TX (US); Brian B. Ginsburg, Allen, TX (US); Srinath M. Ramaswamy, Murphy, TX (US); Eunyoung Seok, Plano, TX (US); Baher Haroun, Allen, TX (US); Bradley A. Kramer, Plano, TX (US); Hassan Ali, Murphy, TX (US); Nirmal C. Warke, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/741,010

(22) Filed: Jan. 14, 2013

(51) Int. Cl.
 *H02M 5/275* (2006.01)
(52) U.S. Cl.
 USPC .......................................................... 363/163
(58) Field of Classification Search
 USPC ........... 363/157, 159, 163; 455/131; 327/115, 327/117
 See application file for complete search history.

(56) References Cited

U.S. PATENT DOCUMENTS

| | | | | |
|---|---|---|---|---|
| 4,910,801 A | * | 3/1990 | Anzini et al. | 455/326 |
| 7,120,414 B2 | * | 10/2006 | Kim et al. | 455/313 |
| 7,227,392 B2 | * | 6/2007 | Yamamoto | 327/122 |
| 8,121,579 B2 | * | 2/2012 | Shiramizu et al. | 455/334 |
| 2006/0145737 A1 | * | 7/2006 | Yamamoto et al. | 327/119 |
| 2011/0187420 A1 | * | 8/2011 | Kuo et al. | 327/119 |
| 2012/0062287 A1 | * | 3/2012 | Jang et al. | 327/156 |
| 2012/0319745 A1 | * | 12/2012 | Ito | 327/119 |

OTHER PUBLICATIONS

U.S. Appl. No. 12/888,208, filed Sep. 22, 2010.

* cited by examiner

*Primary Examiner* — Adolf Berhane
(74) *Attorney, Agent, or Firm* — Alan A. R. Cooper; W. James Brady, III; Frederick J. Telecky, Jr.

(57) ABSTRACT

An apparatus is provided. A differential pair of transistors is configured to receive a first differential signal having a first frequency, and a transformer, having a primary side and a secondary side is provided. The primary side of the transformer is coupled to the differential pair of transistors, and the secondary side of the transformer is configured to output a second differential signal having a second frequency, where the second frequency is greater than the first frequency. A first transistor is coupled to the first supply rail, the primary side of the transformer, and the differential pair of transistors, where the first transistor is of a first conduction type. A second transistor is coupled to the second supply rail, the primary side of the transformer, and the differential pair of transistors, where the second transistor is of a second conduction type.

10 Claims, 1 Drawing Sheet

FREQUENCY MULTIPLIER

CROSS-REFERENCE TO RELATED APPLICATIONS

This application is related to U.S. patent application Ser. No. 13/683,735, entitled "BALUN WITH INTEGRATED DECOUPLING AS GROUND SHIELD," filed on Nov. 21, 2012, which is incorporated by reference herein for all purposes.

TECHNICAL FIELD

The invention relates generally to a frequency multiplier and, more particularly, to a frequency multiplier having lower direct current (DC) power consumption at radio frequency (RF) and millimeter-wave frequencies (e.g., wavelengths between about 0.1 mm and 10 mm).

BACKGROUND

Frequency multipliers have been used in a variety of applications, including RF applications. In FIG. 1, an example of a frequency multiplier 100 with positive feedback can be seen. As shown, this multiplier 100 operates to generate a differential output signal $2f_{LO+}$ and $2f_{LO+}$ that has twice the frequency of the input differential signal $f_{LO+}$ and $f_{LO-}$. In this example, the differential output signal $2f_{LO+}$ and $2f_{LO+}$ can function as a local oscillator signal for a modulator. The input differential signal $f_{LO+}$ and $f_{LO-}$, in the example of FIG. 1, is provided to the gates of transistors Q1 and Q2. Transistors Q1 and Q2 (which, as shown are NMOS transistors) are arranged to form a differential pair of transistors that are coupled between a common node and a supply rail (e.g., ground). Inductor L (which is coupled to a supply rail VDD at its center tap) is coupled to the common node of the differential pair Q1/Q2, along with the gate of transistor Q3 (which, as shown, is an NMOS transistor). The source of transistor Q3 is also coupled to the inductor L.

There are, however, some problems with this arrangement. First, the DC power consumption at RF and millimeter-wave frequencies can be high because of a finite transconductance density. Second there is a lack of biasing flexibility at the output of multiplier 100 due to the existence of a single common mode inductor tap (which, in the example of FIG. 1, is coupled to supply rail VDD). Therefore, a frequency multiplier with improved characteristics is needed.

SUMMARY

In accordance with the present invention, an apparatus is provided. The apparatus comprises a first supply rail; a second supply rail; a differential pair of transistors that are configured to receive a first differential signal having a first frequency; a transformer having a primary side and a secondary side, wherein the primary side of the transformer is coupled to the differential pair of transistors, and wherein the secondary side of the transformer is configured to output a second differential signal having a second frequency, wherein the second frequency is greater than the first frequency; a first transistor that is coupled to the first supply rail, the primary side of the transformer, and the differential pair of transistors, and wherein the first transistor is of a first conduction type; and a second transistor that is coupled to the second supply rail, the primary side of the transformer, and the differential pair of transistors, and wherein the second transistor is of a second conduction type.

In accordance with the present invention, the first transistor has a first passive electrode, a second passive electrode, and a control electrode, wherein the first passive electrode of the first transistor is coupled to the primary side of the transformer, wherein the second passive electrode of the first transistor is coupled to the first supply rail, and wherein the control electrode of the first transistor is coupled to the differential pair of transistors.

In accordance with the present invention, the second transistor has a first passive electrode, a second passive electrode, and a control electrode, wherein the first passive electrode of the first transistor is coupled to the primary side of the transformer, wherein the second passive electrode of the first transistor is coupled to the second supply rail, and wherein the control electrode of the first transistor is coupled to the differential pair of transistors.

In accordance with the present invention, the first supply rail is ground.

In accordance with the present invention, the first transistor is a N-type transistor, and wherein the second transistor is a P-type transistor.

In accordance with the present invention, the first transistor is a NMOS transistor and wherein the second transistor is a PMOS transistor.

In accordance with the present invention, an apparatus is provided. The apparatus comprises a first supply rail; a second supply rail; a first MOS transistor that is coupled between a common node and the first supply rail, wherein the first MOS transistor is configured to receive a first portion of a first differential signal at its gate, and wherein the first differential signal has a second frequency; a second MOS transistor that is coupled between the common node and the second supply rail, wherein the second MOS transistor is configured to receive a second portion of the first differential signal at its gate; a transformer having: a primary side with a first terminal, a second terminal, and a center tap, wherein the first terminal of the primary side of the transformer is coupled to the common node, and wherein the center tap of the primary side of the transformer is configured to receive a common mode voltage; and a secondary side with a first terminal, a second terminal, and a center tap, wherein the first terminal of the secondary side of the transformer is configured to output a first portion of a second differential signal, and wherein the center tap of the secondary side of the transformer is configured to receive a common mode voltage, and wherein the second terminal of the secondary side of the transformer is configured to output a second portion of the second differential signal, wherein the second differential signal has a second frequency, and wherein the second frequency is greater than the first frequency; a third MOS transistor that is coupled between the second terminal of the primary side of the transformer and the second supply rail and that is coupled to the common node at its gate, wherein the third MOS transistor is of a first conduction type; a fourth MOS transistor that is coupled between the second terminal of the primary side of the transformer and the first supply rail and that is coupled to the common node at its gate, and wherein the fourth MOS transistor is of a second conduction type.

In accordance with the present invention, the first, second, and third MOS transistors are NMOS transistors, and wherein the fourth transistor is a PMOS transistor.

In accordance with the present invention, the second frequency is twice the first frequency.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
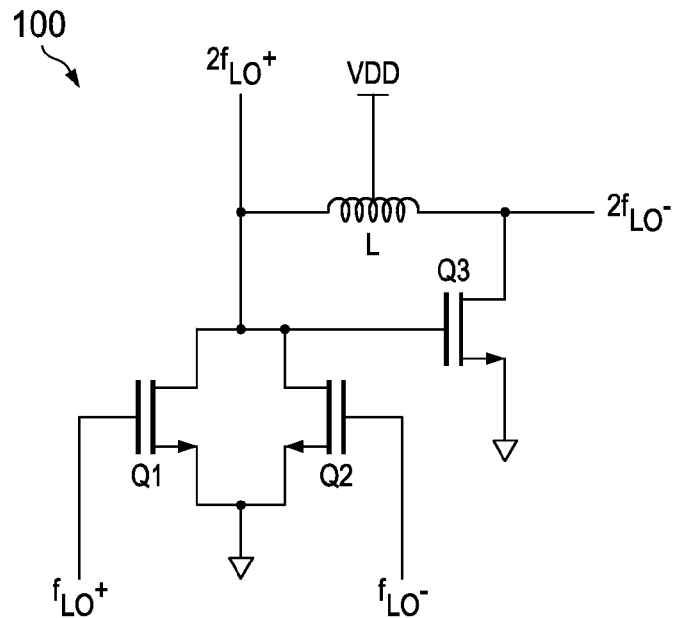
FIG. 1 is a diagram of an example of a conventional frequency multiplier with positive feedback.

Refer now to the drawings wherein depicted elements are, for the sake of clarity, not necessarily shown to scale and wherein like or similar elements are designated by the same reference numeral through the several views.

Figure 2:
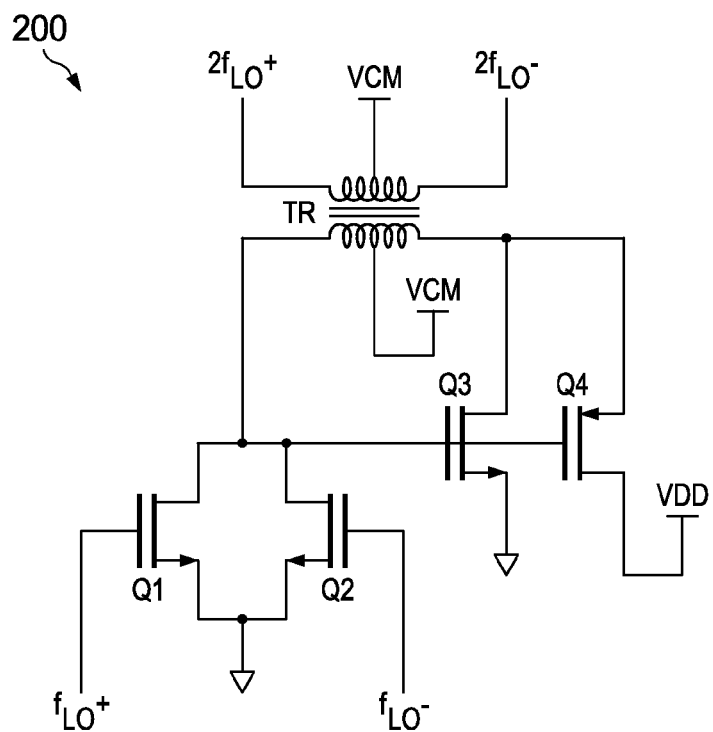
FIG. 2 is a diagram of an example of a frequency multiplier with positive feedback in accordance with the present invention.

Turning to FIG. 2, an example of a frequency multiplier 200 can be seen. Similar to multiplier 100, multiplier 200 can, for example, generate a differential output signal $2f_{LO+}$ and $2f_{LO+}$ that has twice the frequency of the input differential signal $f_{LO+}$ and $f_{LO-}$. There are, however, some differences in topology. Namely, inductor L has been replaced by transformer TR, and transistor Q4 (which can, for example, be a PMOS transistor) has been added. In this configuration, transistors Q3 and Q4 are arranged to be of opposite conduction types; for example, transistors Q3 and Q4 are shown to be NMOS and PMOS transistors, respectively. These transistors Q3 and Q4 are also coupled between supply rails (e.g., supply rail VDD and ground). Because these transistors Q3 and Q4 are commonly coupled to a terminal of the primary side of the transformer TR and because the gates of transistors Q3 and Q4 are coupled to the common node of differential pair Q1/Q2, these transistors Q3 and Q4 operate as "stacked" transconductance devices. By having this stacked arrangement (e.g., source of transistor Q4 being coupled to the drain of transistor Q3), current reuse between these transconductance devices (e.g., transistors Q3 and Q4) is permitted, which can, for example, double the transconductance density.

Better bias can also be achieved. As shown, the transformer TR has replaced the inductor L in this example with the primary side being coupled to the common node of differential pair Q1/Q2 and the drain and source of transistors Q3 and Q4, respectively, and with the secondary side providing differential output signal $2f_{LO+}$ and $2f_{LO+}$. Because the transformer TR can offer at least two center taps (e.g., one on the primary side and one of the secondary side), a common mode voltage VCM can be applied to these center taps. This common mode voltage VCM can be selected to allow for improved (e.g., optimized) biasing for transistors Q3 and Q4.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first supply rail;
   a second supply rail;
   a differential pair of transistors that are configured to receive a first differential signal having a first frequency;
   a transformer having a primary side and a secondary side, wherein the primary side of the transformer is coupled to the differential pair of transistors, and wherein the secondary side of the transformer is configured to output a second differential signal having a second frequency, wherein the second frequency is greater than the first frequency;
   a first transistor that is coupled to the first supply rail, the primary side of the transformer, and the differential pair of transistors, and wherein the first transistor is of a first conduction type; and
   a second transistor that is coupled to the second supply rail, the primary side of the transformer, and the differential pair of transistors, and wherein the second transistor is of a second conduction type.

2. The apparatus of claim 1, wherein the first transistor has a first passive electrode, a second passive electrode, and a control electrode, wherein the first passive electrode of the first transistor is coupled to the primary side of the transformer, wherein the second passive electrode of the first transistor is coupled to the first supply rail, and wherein the control electrode of the first transistor is coupled to the differential pair of transistors.

3. The apparatus of claim 2, wherein the second transistor has a first passive electrode, a second passive electrode, and a control electrode, wherein the first passive electrode of the first transistor is coupled to the primary side of the transformer, wherein second passive electrode of the first transistor is coupled to the second supply rail, and wherein the control electrode of the first transistor is coupled to the differential pair of transistors.

4. The apparatus of claim 3, wherein the first supply rail is ground.

5. The apparatus of claim 4, wherein the first transistor is a N-type transistor, and wherein the second transistor is a P-type transistor.

6. The apparatus of claim 5, wherein the first transistor is a NMOS transistor and wherein the second transistor is a PMOS transistor.

7. An apparatus comprising:
   a first supply rail;
   a second supply rail;
   a first MOS transistor that is coupled between a common node and the first supply rail, wherein the first MOS transistor is configured to receive a first portion of a first differential signal at its gate, and wherein the first differential signal has a second frequency;
   a second MOS transistor that is coupled between the common node and the second supply rail, wherein the second MOS transistor is configured to receive a second portion of the first differential signal at its gate;
   a transformer having:
     a primary side with a first terminal, a second terminal, and a center tap, wherein the first terminal of the primary side of the transformer is coupled to the common node, and wherein the center tap of the primary side of the transformer is configured to receive a common mode voltage; and
     a secondary side with a first terminal, a second terminal, and a center tap, wherein the first terminal of the secondary side of the transformer is configured to output a first portion of a second differential signal, and wherein the center tap of the secondary side of the transformer is configured to receive a common mode voltage, and wherein the second terminal of the secondary side of the transformer is configured to output a second portion of the second differential signal, wherein the second differential signal has a second frequency, and wherein the second frequency is greater than the first frequency;

a third MOS transistor that is coupled between the second terminal of the primary side of the transformer and the second supply rail and that is coupled to the common node at its gate, wherein the third MOS transistor is of a first conduction type;

a fourth MOS transistor that is coupled between the second terminal of the primary side of the transformer and the first supply rail and that is coupled to the common node at its gate, and wherein the fourth MOS transistor is of a second conduction type.

8. The apparatus of claim 7, wherein the first, second, and third MOS transistors are NMOS transistors, and wherein the fourth transistor is a PMOS transistor.

9. The apparatus of claim 8, wherein the second supply rail is ground.

10. The apparatus of claim 8, wherein the second frequency is twice the first frequency.

* * * * *